US007552534B2

(12) United States Patent
Guan et al.

(10) Patent No.: US 7,552,534 B2
(45) Date of Patent: Jun. 30, 2009

(54) METHOD OF MANUFACTURING AN INTEGRATED ORIFICE PLATE AND ELECTROFORMED CHARGE PLATE

(75) Inventors: Shan Guan, Dublin, OH (US); Michael F. Baumer, Dayton, OH (US); Richard W. Sexton, Bainbridge, OH (US); James E. Harrison, Jr., Dayton, OH (US)

(73) Assignee: Eastman Kodak Company, Rochester, NY (US)

( * ) Notice: Subject to any disclaimer, the term of this patent is extended or adjusted under 35 U.S.C. 154(b) by 122 days.

(21) Appl. No.: 11/382,726

(22) Filed: May 11, 2006

(65) Prior Publication Data

US 2007/0261239 A1 Nov. 15, 2007

(51) Int. Cl.
*B21D 53/76* (2006.01)
*H01L 21/441* (2006.01)

(52) U.S. Cl. .......................... 29/890.1; 29/846; 347/63; 347/65; 205/122; 216/27

(58) Field of Classification Search ................ 29/890.1, 29/846, 831; 347/54–56, 65, 76, 63; 204/192.1, 204/197.15, 192.11; 205/122, 123, 125; 216/27, 51, 56, 57, 41; 134/902
See application file for complete search history.

(56) References Cited

U.S. PATENT DOCUMENTS 3,984,843 A 10/1976 Kuhn
4,047,184 A 9/1977 Bassous et al.
4,106,975 A 8/1978 Berkenblit et al.
4,184,925 A 1/1980 Kenworthy
4,213,238 A 7/1980 Gudorf
4,223,320 A 9/1980 Paranjpe et al.
4,271,589 A 6/1981 Gudorf
4,277,548 A 7/1981 Vedder
4,334,232 A 6/1982 Head
4,347,522 A 8/1982 Bahl et al.

(Continued)

FOREIGN PATENT DOCUMENTS

EP 0 938 079 8/1999

(Continued)

OTHER PUBLICATIONS

T. Diepold et al., A Micromachained Continuous Ink Jet Print Head for High-Resolution Printing, J. Micromech. Microeng. 8, 1998, pp. 144-147.

(Continued)

*Primary Examiner*—A. Dexter Tugbang
(74) *Attorney, Agent, or Firm*—William R Zimmerli

(57) ABSTRACT

An integrated orifice array plate and a charge plate is fabricated for a continuous ink jet print head by providing an electrically non-conductive orifice plate substrate having first and second opposed sides and an array of predetermined spaced-apart orifice positions. A plating seed layer is applied to the first of the opposed sides of the substrate, and an array of orifices is formed through the orifice plate substrate at the predetermined orifice positions. The orifices extend between the opposed sides. The plating seed layer is etched, leaving a portion of the plating seed layer adjacent to each of the predetermined orifice positions. A charge electrode is plated onto each of the portions of the plating seed layer.

10 Claims, 6 Drawing Sheets

U.S. PATENT DOCUMENTS 4,373,707 A 2/1983 Molders
4,374,707 A 2/1983 Pollack
4,378,631 A 4/1983 Head et al.
4,560,991 A 12/1985 Schutrum
4,581,301 A * 4/1986 Michaelson ............. 205/125 X
4,626,324 A * 12/1986 Samuels et al. ............. 205/259
4,636,808 A 1/1987 Herron
4,678,680 A 7/1987 Abowitz
4,810,332 A * 3/1989 Pan ............................ 205/125
4,894,664 A 1/1990 Pan
4,928,113 A 5/1990 Howell et al.
4,972,201 A 11/1990 Katerberg et al.
4,972,204 A 11/1990 Sexton
4,999,647 A 3/1991 Wood et al.
5,455,611 A 10/1995 Simon et al.
5,475,409 A 12/1995 Simon et al.
5,512,117 A 4/1996 Morris
5,516,369 A * 5/1996 Lur et al. ................ 134/902 X
5,559,539 A 9/1996 Vo et al.
5,604,521 A 2/1997 Merket et al.
5,820,770 A 10/1998 Cohen et al.
6,164,759 A 12/2000 Fujii et al.
6,375,310 B1 4/2002 Arakawa et al.
6,431,682 B1 8/2002 Osada et al.
6,464,892 B2 10/2002 Moon et al.
6,545,406 B2 4/2003 Hofmann et al.
6,560,991 B1 5/2003 Kotliar
6,627,096 B2 9/2003 Sherrer et al.
6,635,184 B1 10/2003 Cohen et al.
6,660,614 B2 12/2003 Hirschfeld et al.
6,692,112 B2 * 2/2004 Lee et al. .................. 347/63 X
6,749,737 B2 * 6/2004 Cheng et al. ................ 205/125
6,759,309 B2 7/2004 Gross
6,767,473 B2 * 7/2004 Fujita et al. ................... 216/27
6,790,372 B2 * 9/2004 Roy et al. ................. 216/41 X
6,978,543 B2 * 12/2005 Sakamoto et al. .......... 29/890.1
2001/0015001 A1 * 8/2001 Hashizume ................ 29/25.35
2002/0000516 A1 1/2002 Schultz et al.
2002/0000517 A1 1/2002 Corso et al.
2002/0063107 A1 5/2002 Moon et al.
2003/0022397 A1 1/2003 Hess et al.
2003/0054645 A1 3/2003 Sheldon
2003/0056366 A1 * 3/2003 Peng ........................... 29/852
2003/0066816 A1 4/2003 Schultz et al.
2003/0073260 A1 4/2003 Corso
2003/0085960 A1 * 5/2003 Kim et al. ..................... 347/65
2004/0029305 A1 * 2/2004 Chung et al. .................. 438/27
2004/0150080 A1 * 8/2004 Lee et al. .................... 257/678
2005/0067713 A1 * 3/2005 Mutta et al. ................. 257/774
2005/0150683 A1 * 7/2005 Farnworth et al. .......... 174/255

FOREIGN PATENT DOCUMENTS

EP 1 020 291 1/2000
FR 2 698 584 11/1992
JP 01188349 A * 7/1999

OTHER PUBLICATIONS

J. Smith et al., Continuous Ink-Jet Print Head Utilizing Silicon Micromachined Nozzles, Sensors and Actuators A, 43, 1994, pp. 311-316.

Rhonda Renee Myers, Novel Devices for Continuous-on-Demand Ink jet Deflection Technologies, B.S.E.E., University of Cincinnati, Nov. 17, 2005.

* cited by examiner

METHOD OF MANUFACTURING AN INTEGRATED ORIFICE PLATE AND ELECTROFORMED CHARGE PLATE

CROSS REFERENCE TO RELATED APPLICATIONS

Reference is made to commonly assigned, co-pending U.S. patent applications Ser. No. 11/382,773 entitled CHARGE PLATE AND ORIFICE PLATE FOR CONTINUOUS INK JET PRINTERS to Richard W. Sexton et al., Ser. No.11/382,787 entitled SELF-ALIGNED PRINT HEAD AND ITS FABRICATION to Richard W. Sexton et al. and Ser. No. 11/382,759 entitled INTEGRATED CHARGE AND ORIFICE PLATES FOR CONTINUOUS INK JET PRINTERS to Shan Guan et al. filed Concurrently herewith.

FIELD OF THE INVENTION

The present invention relates to continuous ink jet printers, and more specifically to the fabrication of MEMS-bases integrated orifice plate and charge plate for such.

BACKGROUND OF THE INVENTION

Continuous-type ink jet printing systems create printed matter by selective charging, deflecting, and catching drops produced by one or more rows of continuously flowing ink jets. The jets themselves are produced by forcing ink under pressure through an array of orifices in an orifice plate. The jets are stimulated to break up into a stream of uniformly sized and regularly spaced droplets.

The approach for printing with these droplet streams is to use a charge plate to selectively charge certain drops, and then to deflect the charged drops from their normal trajectories. The charge plate has a series of charging electrodes located equidistantly along one or more straight lines. Electrical leads are connected to each such charge electrode, and the electrical leads in turn are activated selectively by an appropriate data processing system.

Conventional and well-known processes for making the orifice plate and charge plate separately consist of photolithography and nickel electroforming. Orifice plate fabrication methods are disclosed in U.S. Pat. Nos. 4,374,707; 4,678,680; and 4,184,925. Orifice plate fabrication generally involves the deposition of a nonconductive thin disk on a metal substrate followed electroplating nickel on the metal substrate to a thickness sufficient to partial coverage the nonconductive thin disk to form an orifice. After formation of the orifice, the metal substrate is selectively etched away leaving the orifice plate electroform as a single component. Charge plate electroforming is described in U.S. Pat. Nos. 4,560,991 and 5,512,117. These charge plates are made by depositing nonconductive traces onto a metal substrate followed by deposition of nickel in a similar fashion to orifice plate fabrication, except that parallel lines of metal are formed instead of orifices. Nickel, which is a ferromagnetic material, is unsuitable for use with magnetic inks. Nor can low pH ink (pH less than, say, 6) be used with nickel, which is etched by low pH ink. U.S. Pat. No. 4,347,522 discloses the use electroforming or electroplating techniques to make a metal charge plate.

An ink jet printhead having an orifice plate and a charge plate requires precise alignment of these components to function properly. For high resolution ink jet printheads this alignment process is a difficult labor intensive operation that also requires significant tooling to achieve. It is desirable to develop a printhead that would simplify the alignment of the charging electrodes and the orifices from which ink is jetted.

Accordingly, it is an object of the present invention to provide a fabrication process of the orifice plate and charge plate that permits the use of both low pH and magnetic inks. It is another object of the present invention to provide such an orifice plate and charge plate as one, self-aligned component with high yield and robust connection.

SUMMARY OF THE INVENTION

According to a feature of the present invention, an integrated orifice array plate and a charge plate is fabricated for a continuous ink jet print head by providing an electrically non-conductive orifice plate substrate having first and second opposed sides and an array of predetermined spaced-apart orifice positions. A plating seed layer is applied to the first of the opposed sides of the substrate, and an array of orifices is formed through the orifice plate substrate at the predetermined orifice positions. The orifices extend between the opposed sides. The plating seed layer is etched, leaving a portion of the plating seed layer adjacent to each of the predetermined orifice positions. A charge electrode is plated onto each of the portions of the plating seed layer.

In a preferred embodiment of the present invention, the opposed sides of the orifice plate substrate are initially coated with a silicon nitride layer and the orifices are formed by etching into the orifice plate substrate through openings in the silicon nitride layer on one of the first and second opposed sides. An ink channel is formed on the second of the opposed sides of the substrate by coating the second opposed side of the substrate with a silicon nitride layer and etching into the orifice plate substrate through an opening in the silicon nitride layer on the second side of the orifice plate substrate. The integrated orifice array plate and a charge plate may be fabricated by forming the ink channel by deep reactive ion etching; the charge plate is formed by electroforming. The step of applying a plating seed layer to the opposed sides of the substrate may be effected by sputtering. The charge electrodes may be placed alternatively on the two sides of the nozzle array.

DETAILED DESCRIPTION OF THE INVENTION

It will be understood that the integral orifice array plate and charge plate of the present invention is intended to cooperate with otherwise conventional components of ink jet printers that function to produce desired streams of uniformly sized and spaced drops in a highly synchronous condition. Other continuous ink jet printer components, e.g. drop ejection devices, deflection electrodes, drop catcher, media feed system, and data input and machine control electronics (not shown) cooperate to effect continuous ink jet printing. Such devices may be constructed to provide synchronous drop streams in a long array printer, and comprise in general a resonator/manifold body to which the orifice plate is attached, a plurality of piezoelectric transducer strips, and transducer energizing circuitry.

Figure 1:
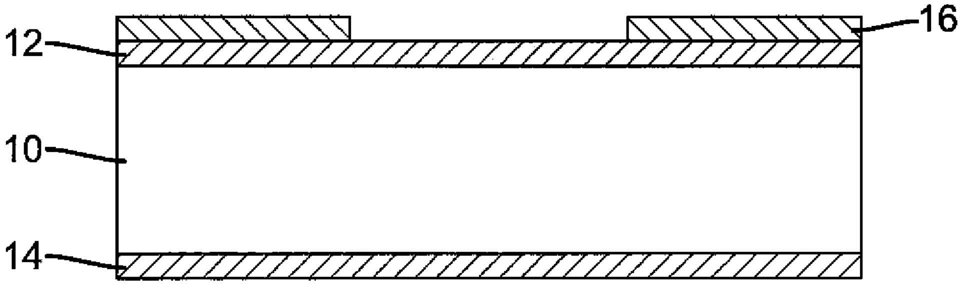
FIG. 1 is a cross-sectional view of a silicon substrate, silicon nitride layer, and patterned photo resist layer usable in the present invention.

FIG. 1 shows a silicon substrate 10 coated on both sides with thin layers 12 and 14 of silicon nitride. The layers may, for example, be 1000-2000 Å of silicon nitride or 5000-10000 Å of low stress silicon nitride. In the preferred embodiment, the silicon substrate is dipped into buffered hydrofluoric acid, which chemically cleans the substrate, prior to application of the silicon nitride layers by a method such as low-pressure chemical vapor deposition. A photoresist 16 has been applied; such as by spin coating, to one side of the composite 10, 12, and 14. The photoresist has been imagewise exposed through a mask (not shown) and developed to leave a pattern for forming an ink channel as detailed below. Positive tone photoresist is preferred.

Figure 2:
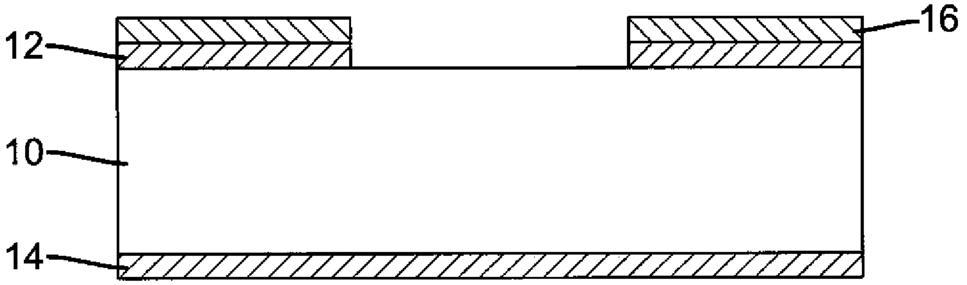
FIGS. 2 and 3 are cross-sectional views of initial steps in a process for fabricating an orifice plate of FIG. 10 from the silicon substrate of FIG. 1.
Figure 3:
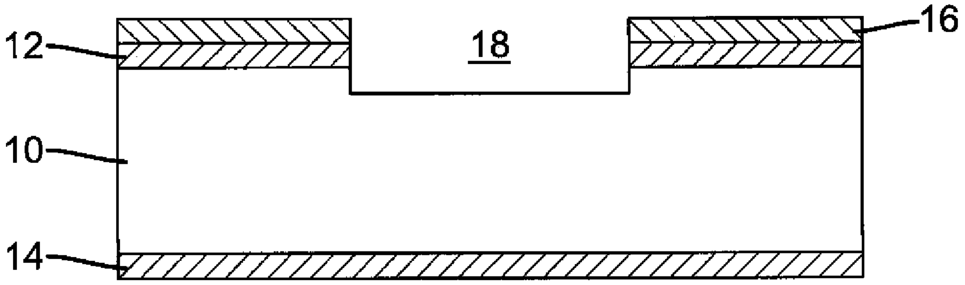
Figure 4:
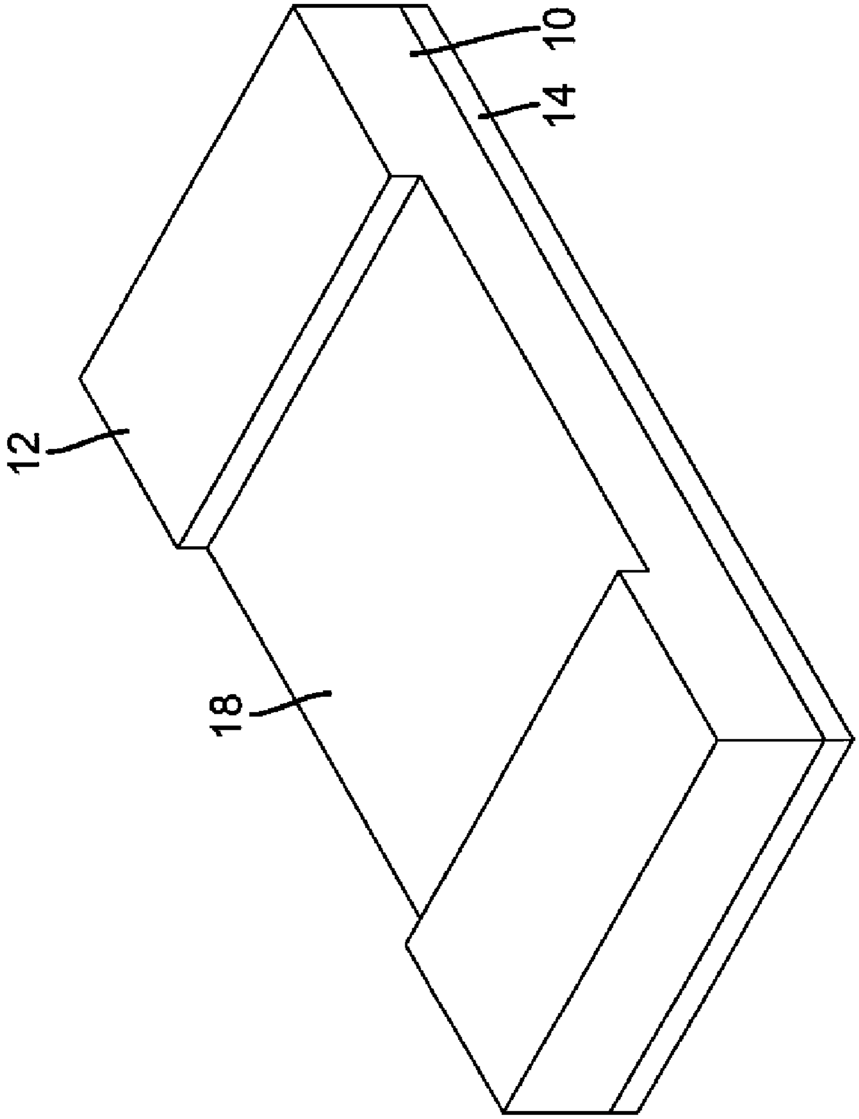
FIG. 4 is a perspective view of the orifice plate at this point in the fabrication process.

Referring to FIG. 2, silicon nitride layer 12 has been etched away according to the photoresist pattern. In FIG. 3, an ink channel 18 has been etched into the silicon substrate 10 such as by means of deep reactive ion etching. The silicon nitride layer 12 acts as an etching mask. Photoresist 16 is stripped using, say, acetone, and the wafer surface is cleaned such as by the use of $O_2$ plasma. FIG. 4 is a perspective view of silicon substrate 10 at this point in the fabrication process.

Figure 5:
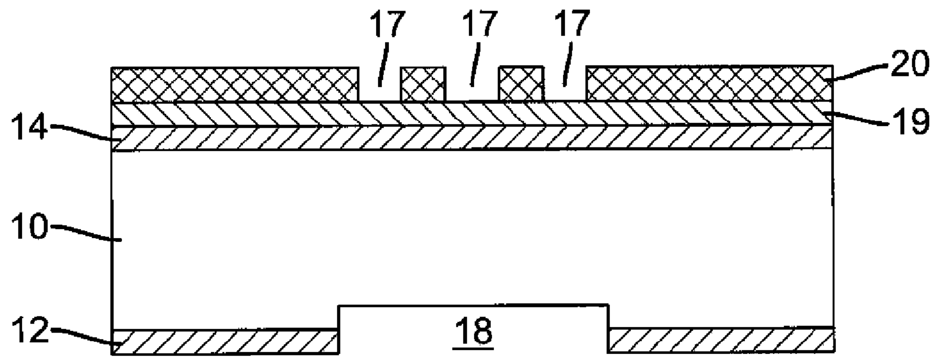
FIGS. 5-13 are cross-sectional views of steps in a process for fabricating an integrated orifice plate and charge plate according to the present invention.

Next, a titanium or chromium adhesive layer is applied to silicon nitride layer 14 and a plating seed layer 19 onto the adhesive layer. The plating seed layer can be either copper or, preferably, gold. Next, a positive tone photoresist 20 is spun onto the plating seed layer 19 and is patterned by, say, photolithography. The pattern produced in this photolithography step corresponds to the conductive lead pattern of the charge plate. In the completed charge plate, these conductive leads connect the drop charging electrodes to the charge driver electronics, which may be fabricated on the silicon substrate, attached to the silicon substrate, or connected to the silicon substrate by means of a flexible circuit. FIG. 5 illustrates the result. In this figure, openings 17 correspond to the space between conductive leads. The center opening includes the area that corresponds to a nozzle trench which will be fabricated later.

Figure 6:
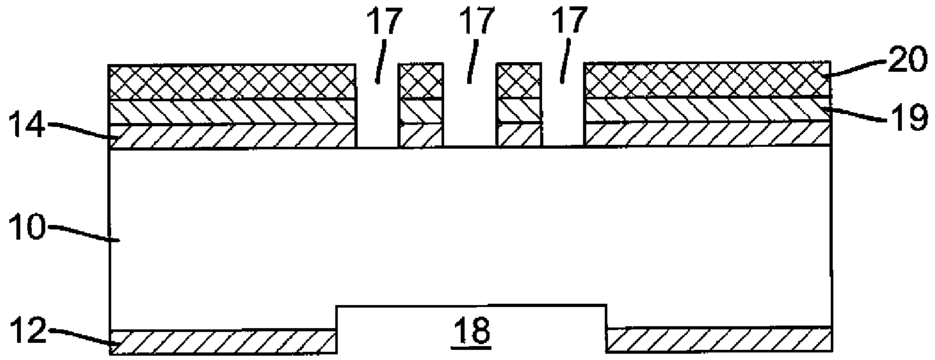

The exposed portion of plating seed layer 19 and silicon nitride layer 14 is chemically etched away. Etching may be carried out such as by reactive ion etching. The result is shown in FIG. 6.

Figure 7:
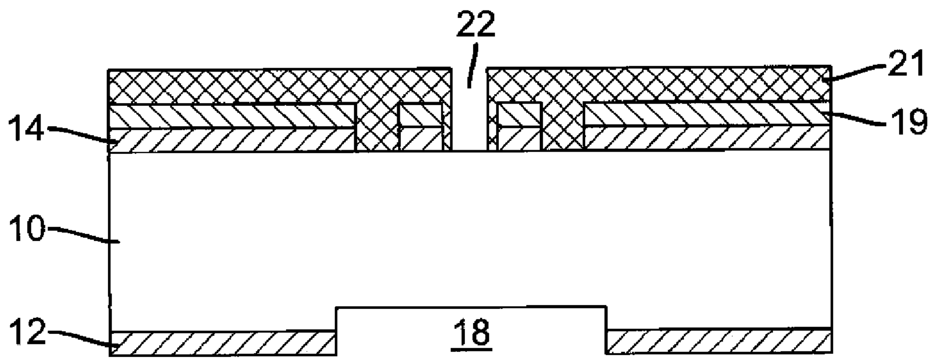
Figure 8:
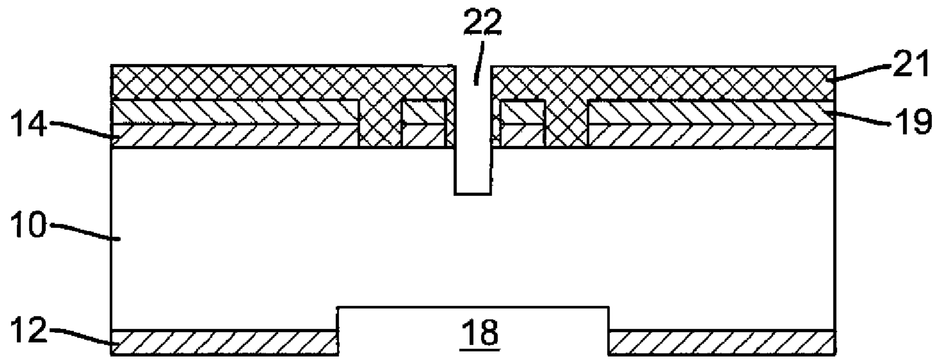

The photoresist layer 20 is removed and new positive photoresist layer 21 is applied. This photoresist layer 21 is patterned as illustrated in FIG. 7, so as to define array of predetermined spaced-apart orifice positions. Referring to FIG. 8, a hole 22 is etched into silicon substrate 10 using deep reactive ion etching. Deep reactive ion etching is a special form of reactive ion etching that provides a deep etched profile with relatively straight sidewalls. The etching depth, illustrated in FIG. 8, is controlled by the duration of the etching process.

Figure 9:
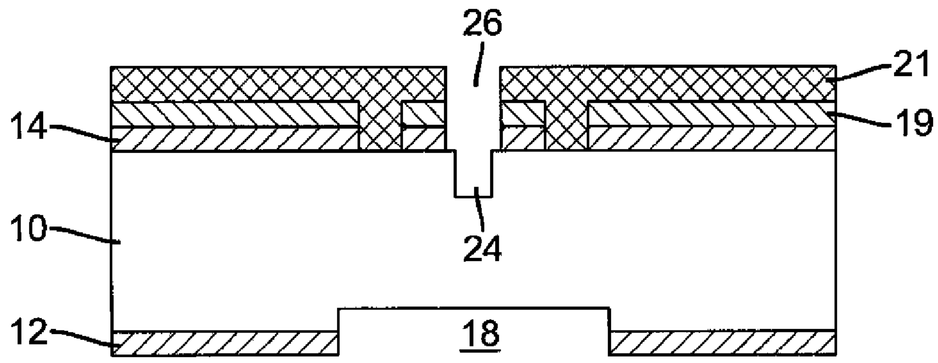
Figure 10:
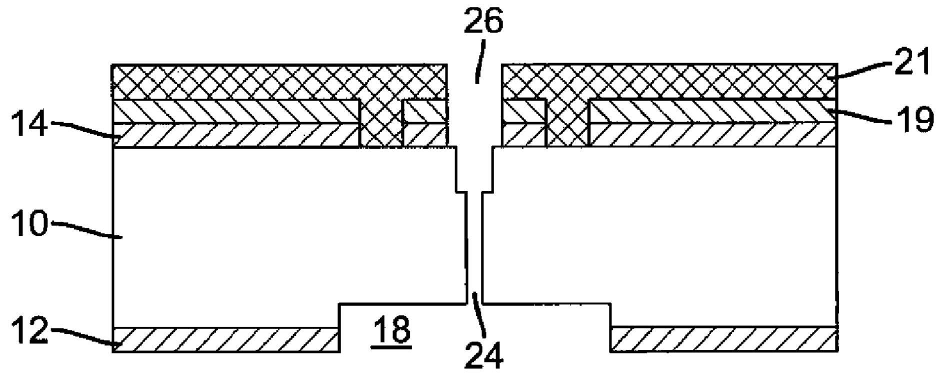
Figure 11:
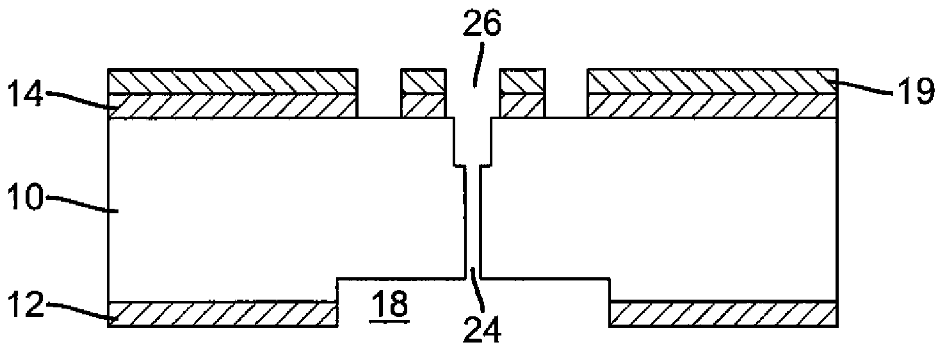

The positive photoresist layer 21 is repatterned to expose additional portions of silicon nitride layer 12 as illustrated in FIG. 9. The newly exposed area will produce a trench around the array of orifices. Referring to FIG. 10, nozzle openings 24 and the trench 26 are simultaneously deep reactive ion etched. Ink channel 18 acts as an etching stop when the nozzle openings break through silicon substrate 10 because the helium flow rate in the deep reactive ion etching process changes to stop the etching process. Photoresist 20 is stripped using, say, acetone and the wafer surface is $O_2$ plasma cleaned as illustrated in FIG. 11.

Figure 12:
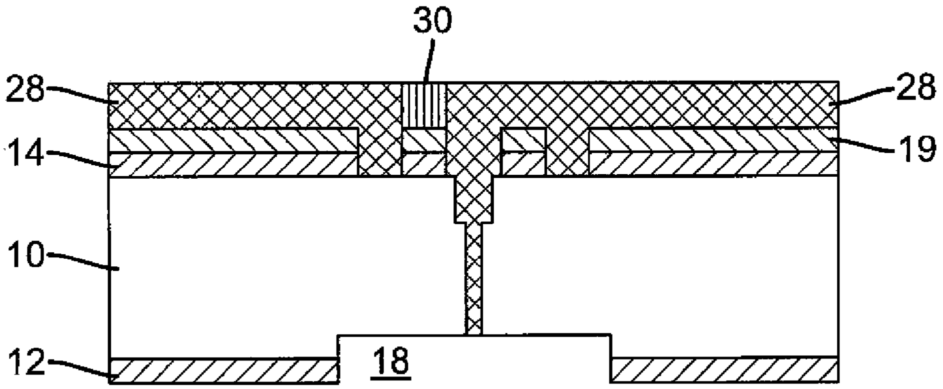
Figure 13:
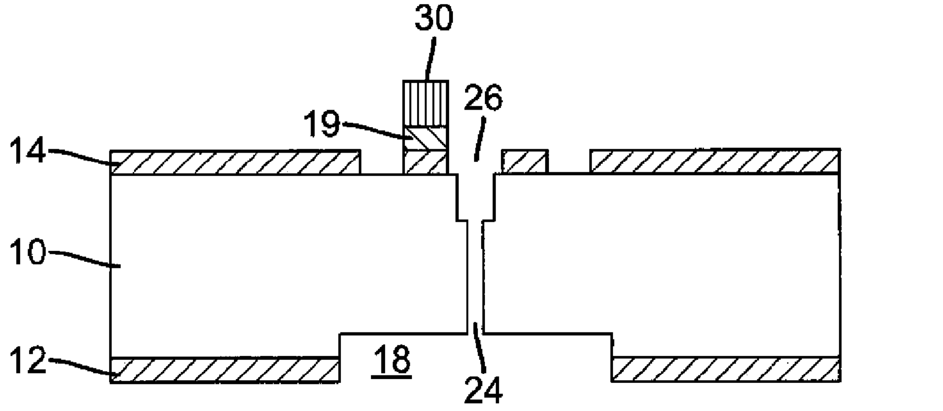
Figure 14:
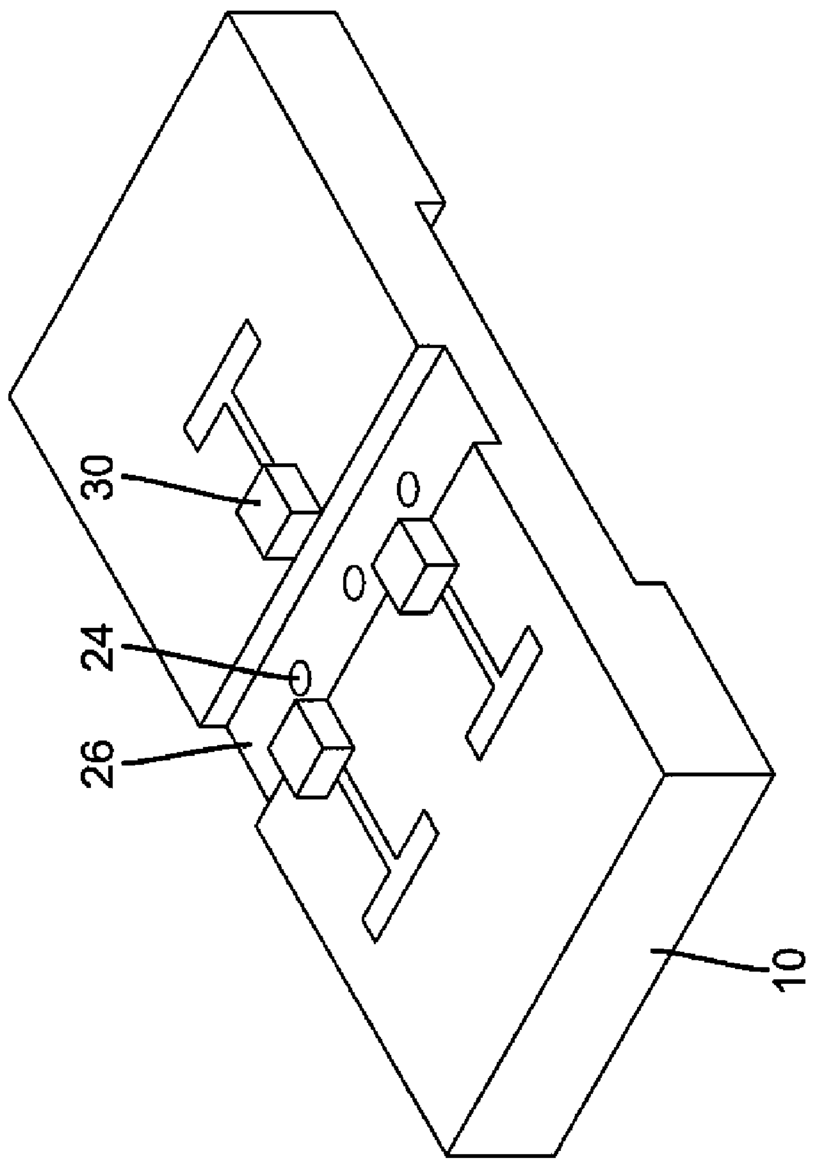
FIG. 14 is a perspective view of the completed integral charge plate and orifice plate according to the present invention.

FIG. 12 shows a layer of thick photoresist 28 that has been spun onto plating seed layer 19 and planarized such as by chemical mechanical polishing. This thick photoresist is patterned to form openings for electroplating charge electrodes on top of the plating seed layer 19. Charge electrodes 30 of gold, copper, or nickel are plated, one per nozzle opening, adjacent each nozzle opening. After all of the photoresist is stripped using acetone and the wafer is again cleaned using $O_2$ plasma, the fabrication of the charge plate is complete, as shown in FIGS. 13 and 14. Note that charge electrodes 30 alternate from one side of the nozzle orifice array to the other for purposes of reduction of cross-talk and of increased nozzle packing density, but that this is not required to practice the present invention.

The invention has been described in detail with particular reference to certain preferred embodiments thereof, but it will be understood that variations and modifications can be effected within the spirit and scope of the invention.

PARTS LIST

10. silicon substrate
12. silicon nitride layer
14. silicon nitride layer
16. photoresist
17. openings
18. ink channel
19. plating seed layer
20. photoresist
21. photoresist
22. hole
24. nozzle opening
26. trench
28. photoresist
30. charge electrode

The invention claimed is:

1. A method for integrally fabricating a combined orifice array plate and charge plate for a continuous ink jet printer print head, said method comprising the steps of:

providing an electrically non-conductive orifice plate substrate having first and second opposed sides, said orifice plate substrate having an array of predetermined spaced-apart orifice positions;

applying a plating seed layer to said first side of the substrate;

forming an array of orifices through the orifice plate substrate at the predetermined orifice positions, said orifices extending between said first and second opposed sides;

etching the plating seed layer, leaving a portion of the plating seed layer adjacent to each of the predetermined orifice positions; and plating a charge electrode on each of the portions of the plating seed layer.

2. The method for integrally fabricating a combined orifice array plate and charge plate as set forth in claim 1, wherein:

the first and second opposed sides of the orifice plate substrate are initially coated with a silicon nitride layer; and the orifices are formed by etching into the orifice plate substrate through openings in the silicon nitride layer on the first side.

3. The method for integrally fabricating a combined orifice array plate and charge plate as set forth in claim 1, wherein:

the first and second opposed sides of the orifice plate substrate are initially coated with a silicon nitride layer; and the orifices are formed in a trench by etching into the orifice plate substrate through openings in the silicon nitride layer on the first side.

4. The method for integrally fabricating a combined orifice array plate and charge plate as set forth in claim 1 wherein the step of applying a plating seed layer to said first opposed side of the orifice plate substrate is effected by sputtering.

5. The method for integrally fabricating a combined orifice array plate and charge plate as set forth in claim 1 wherein the charge electrodes alternate from one side of the orifice array to the other.

6. The method for integrally fabricating a combined orifice array plate and charge plate as set forth in claim 1 wherein the step of forming the array of charge electrodes is effected by electroplating.

7. The method for integrally fabricating a combined orifice array plate and charge plate as set forth in claim 1 wherein step of etching the plating seed layer is effected by wet etching.

8. A method for integrally fabricating a combined orifice array plate and charge plate for a continuous ink jet printer print head, said method comprising the steps of:

providing an electrically non-conductive orifice plate substrate having first and second opposed sides, said orifice plate substrate having an array of predetermined spaced-apart orifice positions;

applying a plating seed layer to said first side of the orifice plate substrate;

forming an array of orifices through the orifice plate substrate at the predetermined orifice positions, said orifices extending between said first and second opposed sides;

etching the plating seed layer, leaving a portion of the plating seed layer adjacent to each of the predetermined orifice positions;

plating a charge electrode on each of the portions of the plating seed layer; and forming an ink channel on said second opposed side of the orifice plate substrate.

9. The method for integrally fabricating a combined orifice array plate and charge plate as set forth in claim 8, wherein the ink channel is formed by:

coating said second opposed side of the orifice plate substrate with a silicon nitride layer; and etching into the orifice plate substrate through an opening in the silicon nitride layer on the second side of the orifice plate substrate.

10. The method for integrally fabricating a combined orifice array plate and charge plate as set forth in claim 8, wherein etching into the orifice plate substrate to form the ink channel is effected by deep reactive ion etching.

* * * * *